United States Patent [19]
Fukuda et al.

[11] Patent Number: 5,623,161
[45] Date of Patent: Apr. 22, 1997

[54] ELECTRONIC ELEMENT AND METHOD OF PRODUCING SAME

[75] Inventors: Koichi Fukuda, Sendai; Tomofumi Oba; Chisato Iwasaki, both of Miyagi-ken; Yasuhiko Kasama, Sendai; Tadahiro Ohmi, 1-7 Yukigaya, Otsuka-Cho, Ota-ku, Tokyo, all of Japan

[73] Assignees: Frontec, Incorporated; Tadahiro Ohmi, both of Sendai, Japan

[21] Appl. No.: 442,906

[22] Filed: May 17, 1995

[30]    Foreign Application Priority Data

May 20, 1994    [JP]    Japan ..................... 6-106935

[51] Int. Cl.$^6$ .................................................. H01L 23/58
[52] U.S. Cl. ................. 257/649; 257/57; 257/59; 257/66; 257/72; 257/411
[58] Field of Search ................. 257/57, 59, 66, 257/72, 411, 639, 649, 760, 923, 640

[56]    References Cited

U.S. PATENT DOCUMENTS

| | | | |
|---|---|---|---|
| 4,365,264 | 12/1982 | Mukai et al. | 257/639 |
| 4,692,344 | 9/1987 | Kaganowicz et al. | 427/579 |
| 4,717,602 | 1/1988 | Yamazaki | 427/583 |
| 5,371,398 | 12/1994 | Nishihara | 257/435 |

FOREIGN PATENT DOCUMENTS 2-35776    2/1990    Japan ..................... 257/773

*Primary Examiner*—Jerome Jackson, Jr.
*Assistant Examiner*—John Guay
*Attorney, Agent, or Firm*—Guy W. Shoup; Patrick T. Bever

[57]    ABSTRACT

An electronic element having a sufficient dielectric strength remarkably superior to any of the conventional ones. In this element, a conductive wire pattern is formed on the surface of a substrate which is insulative at least in its surface, and an insulating layer is so formed as to cover the substrate and the wire pattern either partially or entirely. The insulating layer is composed of a silicon nitride film where the oxygen content is less than 10 atomic percent at least in the vicinity of a step portion of the wire pattern. There is also provided a method of producing such electronic element, wherein the insulating layer is formed by plasma enhanced CVD under the conditions that the following relationship among a film forming temperature T (° C.), an ion flux I (A) and a film forming speed v (nm/min): $T \geq -651$ $(I/v)+390$, $150 \leq T \leq 350$ (where the ion flux denotes the current (A) per 60×60 cm$^2$). According to this method, an insulating film of a high withstand voltage with a great dielectric strength can be obtained stably at a high yield rate.

3 Claims, 5 Drawing Sheets

ELECTRONIC ELEMENT AND METHOD OF PRODUCING SAME

BACKGROUND OF THE INVENTION

1. Field of the Invention

The present invention relates to an electronic; element and a method of producing the same, and more particularly to an electronic element where a wire pattern is formed on the surface of an insulative substrate and further an insulating film of silicon nitride is so formed as to cover the surface thereof.

2. Description of the Related Art

As an example of such electronic element, the related art will be described below with respect to a thin film transistor (hereinafter referred to as "TFT") used for driving an active matrix liquid crystal display element shown in FIG. 7.

FIG. 8 is a sectional view taken along the line ①–①' in FIG. 7 where a TFT is illustrated conceptionally. Since FIG. 8 is a conceptional view, the dimensions thereof and so forth are entirely different from those of an actual element.

In FIG. 8, reference numeral 9 denotes a gate electrode (wire pattern) formed on a substrate 5 by patterning, and reference numeral 10 denotes a gate wire (wire pattern). Denoted by 3 is an insulating film, in which 3a is a gate insulting film, and 3b is an interlayer insulating film at a wire intersection.

There are also shown a source electrode 11, a source wire 12 and a drain electrode 13.

A thin film of silicon nitride is used frequently as the gate insulating film 3a or the insulating film 3b at the intersection of multilayer metal wires in a TFT array.

As for the composition of such silicon nitride thin film, the atomic ratio of silicon:nitrogen is approximately 3:4, and it is generally preferred that an extremely small amount of hydrogen be contained therein for stabilizing the film quality. Such insulating film is formed principally by plasma enhanced CVD (chemical vapor deposition). A typical material gas employed usually is composed of silane-nitrogen base, silane-ammonia-nitrogen base, silane-ammonia-hydrogen base, silane-nitrogen-hydrogen base, or silane-ammonia-nitrogen-hydrogen base.

However, in any electronic element represented by a TFT where such a silicon nitride insulating film is used as the gate insulating film 3a or the interlayer insulating film 3b at the intersection of multilayer wires, there may arise a problem of electric short circuit among the gate electrode 9, the gate wire 10 and the wire (source wire 12, source electrode 11 or the like) formed via an insulating film. Particularly on any substrate having a high integration density or a large area, the probability of such short-circuiting trouble is rendered extremely high. Such short circuit occurs during use of a final product or in the process of production. In the case of a final product, occurrence of this trouble brings about deterioration of the product reliability. Meanwhile in the process of production, there exists a disadvantage of lowering the yield rate. For example, in a photoresist step executed for forming a contact hole after forming the source wire 12 and so forth, dielectric breakdown may be caused during the step between the source wire 12 and the gate wire 10 or the gate electrode 9.

On the basis of the idea that such defects are derived from the existence of pin holes in the insulating film, there is known a contrivance disclosed in Japanese Patent Laid-open No. Sho 58 (1983)-190042, wherein an attempt is made to solve the above problems by adopting a multilayer insulating film structure where a non-doped amorphous silicon layer 15 is laminated at the intersection of the gate wire 10 and the source wire 12. According to this technique, however, the requisite is such that the insulating layer needs to be formed into a multilayer structure instead of a single layer structure, whereby it is rendered unavoidable that the process of production is complicated.

Under the circumstances mentioned above, there is demanded an improved electronic element represented by a TFT which is excellent in the insulation characteristics even with a single-layer insulating film structure and is still producible with facility.

Particularly in the present stage, since the electronic elements are used frequently in severe environment, it is preferred that the insulating film retains a high withstand voltage with a great dielectric strength above 6 MV/cm. It is also desired that, from a viewpoint of extremely miniaturizing the electronic element, the thickness of the insulating film be less than 500 nm, preferably in a range of 200 to 400 nm. Therefore, in the desired element, the insulating film needs to have a high withstand voltage with a sufficient dielectric strength above 6 MV/cm even if the film thickness is as small as 200 nm or so.

In the current stage of the related technology, any electronic element capable of meeting the above requisite has not been developed yet.

SUMMARY OF THE INVENTION

It is an object of the present invention to provide an electronic element having excellent insulation characteristics with a sufficient dielectric strength far superior to that of any conventional element known heretofore.

And another object of the invention resides in providing an electronic element producing method adapted to obtain a satisfactory insulating film stably at a high yield rate.

According to one aspect of the present invention, there is provided an electronic element where a conductive wire pattern is formed on the surface of a substrate which is insulative at least in its surface, and an insulating layer is formed on the substrate and the wire pattern in a manner to cover the same either partially or entirely. In this electronic element, the insulating layer is composed of such a silicon nitride film that, at least in the vicinity of a step portion of the pattern, the oxygen content is less than 10 atomic percent.

According to another aspect of the present invention, there is provided a method for production of an electronic element where a conductive wire pattern is formed on the surface of a substrate which is insulative at least in its surface, and the substrate and the wire pattern are covered with an insulating layer of silicon nitride either partially or entirely. In this method, the insulating layer of silicon nitride is formed under the conditions satisfying the following relationship inclusive of a film forming temperature T (° C.), an ion flux I (A) and a film forming speed v (nm/min):

$T \geq -651 \, (I/v) + 390$ $150 \leq T \leq 350$ (where the ion flux represents the current (A) per 60×60 cm$^2$).

The present invention has been accomplished on the basis of the fact discovered during an attempt to achieve fundamental improvements of the conventional electronic elements.

More specifically, regarding an insulating film of silicon nitride, one of the reasons that a high insulation withstand voltage or a sufficient dielectric strength fails to be attained stably in the related art has been thought heretofore to result principally from local film defects and flaws in a step portion of a wire pattern. However, the present inventor has found that the dielectric strength is notably affected by the oxygen content in the film, particularly in the vicinity of the step portion.

In the prior art, no consideration was observed with respect to the relationship between the dielectric strength and the oxygen content in a film, and it was not known at all that a region containing high-concentration oxygen is formed in the vicinity of a step portion and also that such high-concentration oxygen region causes deterioration of the insulation characteristics inclusive of the dielectric strength.

Although it is not exactly apparent why oxygen is contained at a high concentration in the vicinity of a step portion and why such oxygen content lowers the dielectric strength, an insulating film of a high withstand voltage with a sufficient dielectric strength above 6 MV/cm can be obtained by reducing the oxygen content to less than 10 atomic percent, hence enabling provision of a high-characteristic electronic element where superior reliability can be ensured. Further, since a sufficient dielectric strength can be attained with facility, the degree of freedom is enhanced in design and therefore this technique is rendered applicable to any of wide-range electronic elements as well as to TFTs.

Meanwhile the silicon nitride insulating film with a small oxygen content in the vicinity of the step portion can be obtained by optimizing the film forming temperature T (° C.), the ion flux I (A) and the film forming speed v (nm/min) in the plasma enhanced CVD.

Namely, a silicon nitride insulating film having a high withstand voltage or a sufficient dielectric strength can be formed by setting the above three parameters within specific ranges represented by the following expressions.

$T \geq -651 \, (I/V) + 390$

In the above, the ion flux I is such as described in Japanese Patent Application No. Hei 2 (1990)-252847, i.e., it has the value defined as:

$I = Pwrf/Vpp$ where Pwrf: input power to RF electrode

Vpp: difference between maximum and minimum (peak-to-peak value) of high-frequency potential applied to RF electrode In the present invention, the ion flux is standardized by the unit size $60 \times 60 \, cm^2$ of the RF electrode.

Due to the film forming process executed under the conditions mentioned above, it is considered that the ions effectively contribute to deposition of the film to consequently realize an improved silicon nitride film having a reduced oxygen content in the vicinity of the step portion.

When the film forming temperature exceeds 350° C., there may occur some undesirable phenomena including deformation of a substrate and cracking derived from stress strain of the film and so forth formed in the other production process of the electronic element, and therefore the film forming temperature should be lower than 350° C. Meanwhile, at any temperature below 150° C., the ion flux required for forming a satisfactory film of a high withstand voltage with a sufficient dielectric strength amounts to an extremely great quantity, or the film forming speed needs to be lowered, so that another problem arises in both the production system and the productivity. For this reason, it is desired that the film forming temperature be higher than 150° C.

The above and other features and advantages of the present invention will become apparent from the following description which will be given with reference to the illustrative accompanying drawings.

DESCRIPTION OF THE PREFERRED EMBODIMENT

Figure 1:
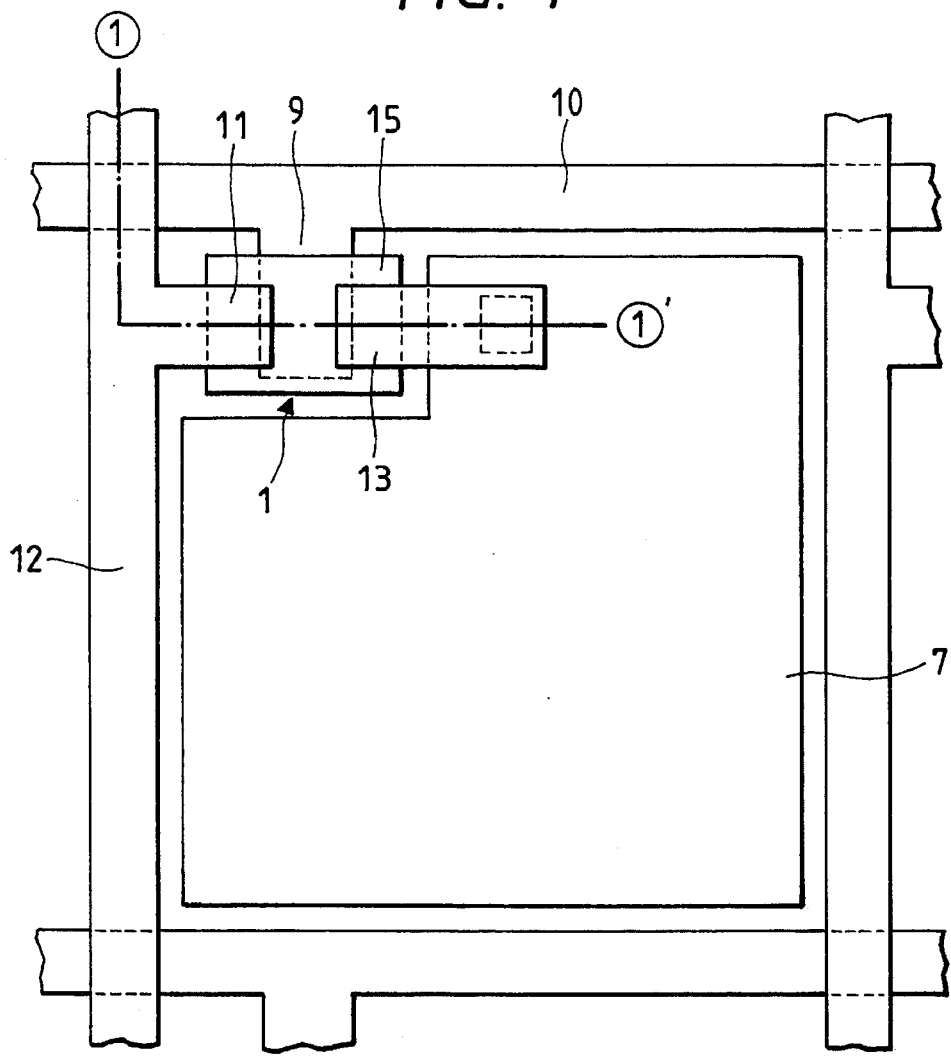
FIG. 1 is a plan view of a thin film transistor produced in a preferred embodiment of the present invention.

Hereinafter the structure of the present invention will be described with a preferred embodiment thereof.

(Electronic element)

An electronic element mentioned as a subject of the present invention is such that a conductive wire pattern is formed on the surface of a substrate which is insulative at least in its surface, and an insulating film of silicon nitride is so formed as to cover the substrate and the wire pattern either partially or entirely.

Such electronic element may be, for example, a TFT element, capacitive element, light emitting element, optical sensor or solar battery.

The substrate may be insulative at least in its surface, or an entirely insulative substrate (e.g., ceramic substrate of glass or the like) may be used as well, or it may be such that an insulating film (composed of, e.g., $SiO_2$ or $Si_3N_4$) is formed on the surface of a conductive or semiconductive substrate. And any of such substrates may be selected in conformity with the kind of the electronic element.

Although the material of the conductor wire pattern is not limited in particular, it is appropriate to use Cr, Al, Cu or some other metal or an alloy thereof. In the gate electrode, the conductor width of the wire pattern is preferably less than 10 µm, more preferably less than 7 µm, and most preferably 5 µm. Although different depending on the conductivity of the material, the thickness in the case of Cr is preferably within a range of 100 to 200 nm. It is possible in this range to reduce the level difference between the surfaces of oriented films on a TFT array, hence enhancing the display performance of an LCD.

(Angle of wire-pattern step portion)

In the present invention, high insulation characteristics can be obtained when the contact angle of the wire pattern with the substrate surface ranges from 60° to 90°.

If a silicon nitride insulating film is deposited under the condition where the contact angle of the wire pattern is set to be less than 60°, the dielectric strength attainable between the electrodes is rendered sufficient, but it becomes necessary to increase the conductor wire width or thickness of the each electrode to a larger value beyond the requisite. That is, while a sectional area greater than predetermined dimensions needs to be ensured for preventing generation of heat and so forth in the electrodes or wires, in case the contact angle is less than 60°, it is obliged to further widen or thicken the conductor wire for filling up the reduced portion.

To increase the wire width or thickness of the electrode beyond the requisite is contrary to the demand of further miniaturizing the element. Particularly in the case of a TFT used for driving a liquid crystal display element, it is desired that the wire width be less than 7 μm so as to minimize the area where external light is shaded by the electrode (wire), but the above increase is contrary to this demand.

It is therefore demanded to set the contact angle over 60°. In the prior art, there arises a problem that the insulation characteristic is extremely deteriorated when this angle exceeds 60°, and the point of the present invention resides exactly in solving this problem.

Control of the contact angle over 60° may be achieved by execution of, e.g., anisotropic wet or dry etching.

(Thickness of insulating film)

In view of realizing a high integration density and a fast operation, the thickness of the insulating film in the present invention is preferably less than 500 nm, and more preferably in a range of 200 to 400 nm. Even when it is as thin as 200 nm, a remarkable advantage is achieved as the dielectric strength attained is greater than 6 MV/cm.

[Preferred embodiment]

Hereinafter a preferred embodiment of the present invention will be described in detail. It is a matter of course that the scope of the invention is not limited to the following embodiment alone.

The embodiment represents an example where the present invention is applied to an intersection of multilayer metal wires in a TFT employed as an active matrix liquid crystal display element.

Figure 2:
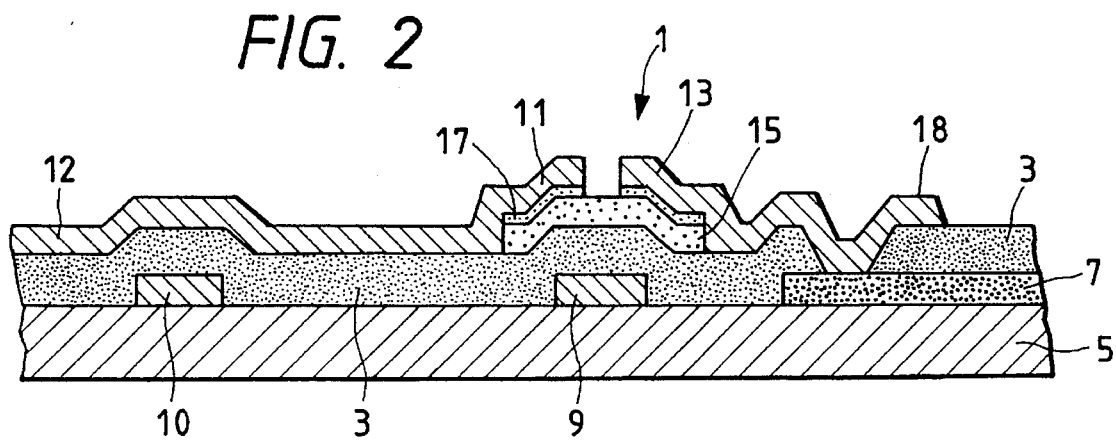
FIG. 2 is a sectional view taken along a line ①–①' shown in FIG. 1.

The TFT in this embodiment has an inverse stagger structure, which will now be described below with reference to FIGS. 1 and 2.

An ITO film was formed on the surface of a glass substrate (coning #7059) 5, and then patterning was executed to form a transparent electrode (ITO electrode) 7 which serves as a pixel electrode.

Subsequently a Cr film was formed in a thickness of 100 nm, and after coating and development of a resist, a gate wire 10 of a width 5 μm and a gate electrode 9 of a width 7 μm were formed by etching.

At the time of such etching, the anisotropy of wet or dry etching was controlled to thereby control the angle of the substrate 5 with the gate wire 10 or the gate electrode 9. In this embodiment, the angle was controlled to be approximately 90°.

Thereafter an insulating film of silicon nitride was formed by plasma enhanced CVD in a manner to cover the substrate 5, the gate electrode 9 and the gate wire 10. This film forming step was executed under various conditions given below. The insulating film of silicon nitride serves as a gate insulating film and an interlayer insulating film in the TFT.

(Conditions for forming silicon nitride insulating film)

Film forming apparatus: Parallel plate in-line type made by Anelva Corp.

RF electrode area: 60×60 cm$^2$

Introduced gas (sccm)
  $SiH_4$: 50
  $NH_3$: 150
  $N_2$: 500
  Ar: 500

Pressure: 150 Pa

Substrate temperature: 150°–400° C.

RF power: 100–500 W

Excitation frequency: 13.56 MHz

Film thickness: 200 nm, 300 nm

Subsequently a semiconductor layer (i:a-Si layer) 15, which was composed of amorphous silicon without addition of any impurity, was formed in a thickness of approximately 100 nm by an ordinary process, and then an amorphous silicon layer ($n^+$:a-Si layer) with addition of P was formed in the same chamber as an ohmic contact 17 in a thickness of approximately 20 nm.

After the step relative to the resist, the amorphous silicon film was removed by wet etching with the exception of the channel alone in the TFT. The etching liquid used was an etchant containing HF. In this case, the surface of the silicon nitride film exposed due to removal of the amorphous silicon film is exposed to the etching liquid during the over-etching time and is thereby etched slightly.

Next to the step relative to the resist, a contact hole reaching the transparent electrode (ITO) 7 was formed by dry etching.

Subsequently a Cr film was formed in a thickness of 300 nm, and a source electrode 11, a source wire 12, a drain electrode 13 and a drain wire 18 were formed. In this embodiment, as shown in FIG. 2, the source wire 12 was so designed as to traverse over the gate wire 10. The drain wire 18 and the transparent electrode (ITO) 7 were connected to each other via a contact hole provided at an adequate position on the transparent electrode 7. The channel in the TFT was so designed as to be 4 μm in length and 6 μm in width.

[Evaluation test]

With regard to the TFT element thus produced under the various conditioned mentioned, the dielectric strength (withstand voltage) was measured, and there was examined the relationship between such dielectric strength and the ratio (I/v) of the ion flux and the film forming speed obtained from the film forming conditions. The result is graphically shown in FIG. 3. The measurement of the dielectric strength was performed by the use of #4142B (made by Hewlett-Packard Co.) with application of a voltage between the gate electrode and the drain electrode.

Figure 3:
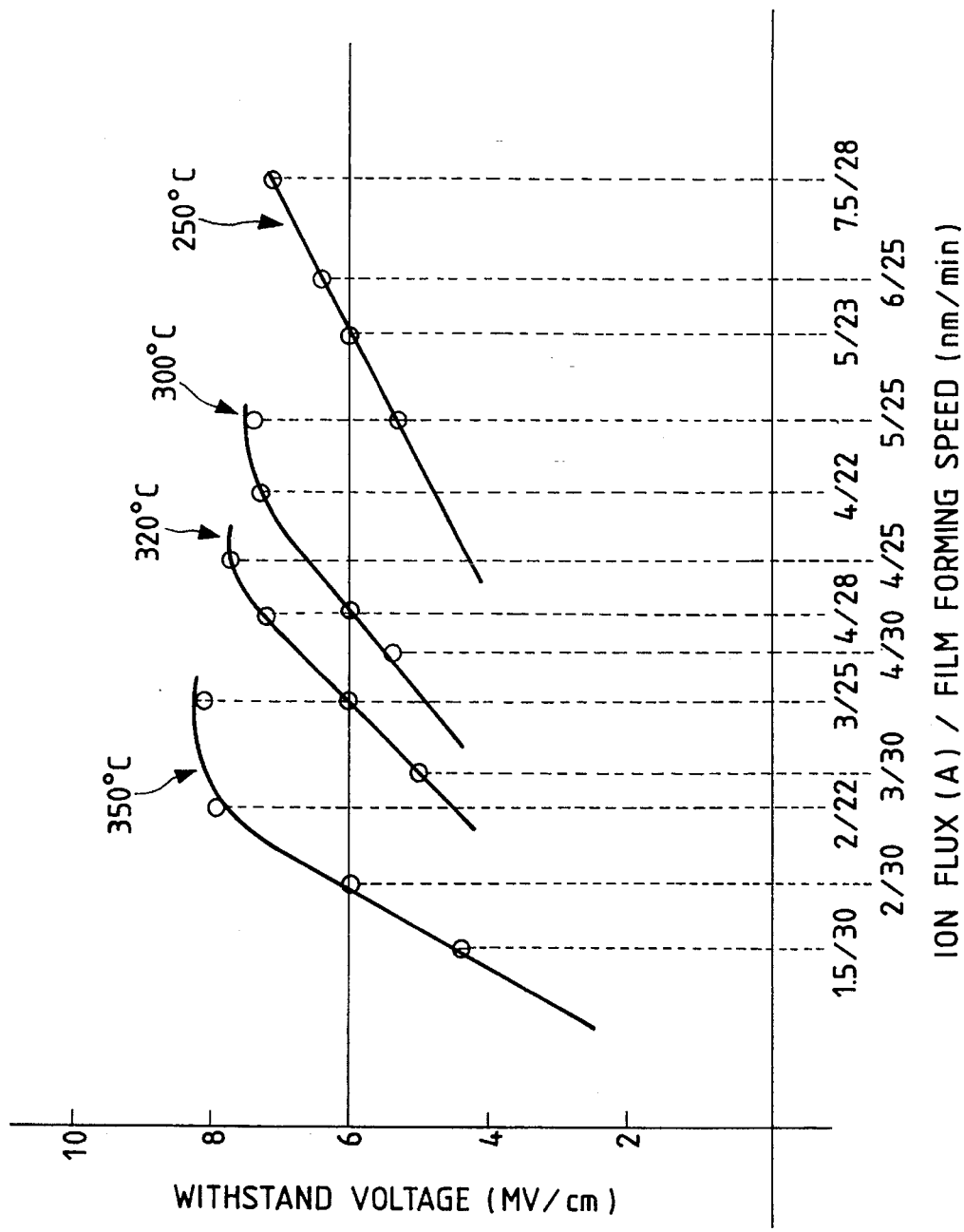
FIG. 3 graphically shows the relationship between the dielectric strength (withstand voltage) of a silicon nitride insulting film and the ion flux (I)/film forming speed (v) thereof.

As shown in FIG. 3, it is seen that the dielectric strength increases in accordance with an increase of the ratio I/v at any film forming temperature and also that a great dielectric strength above 6 MV/cm can be obtained when the ratio I/v is set to a proper value.

Figure 4:
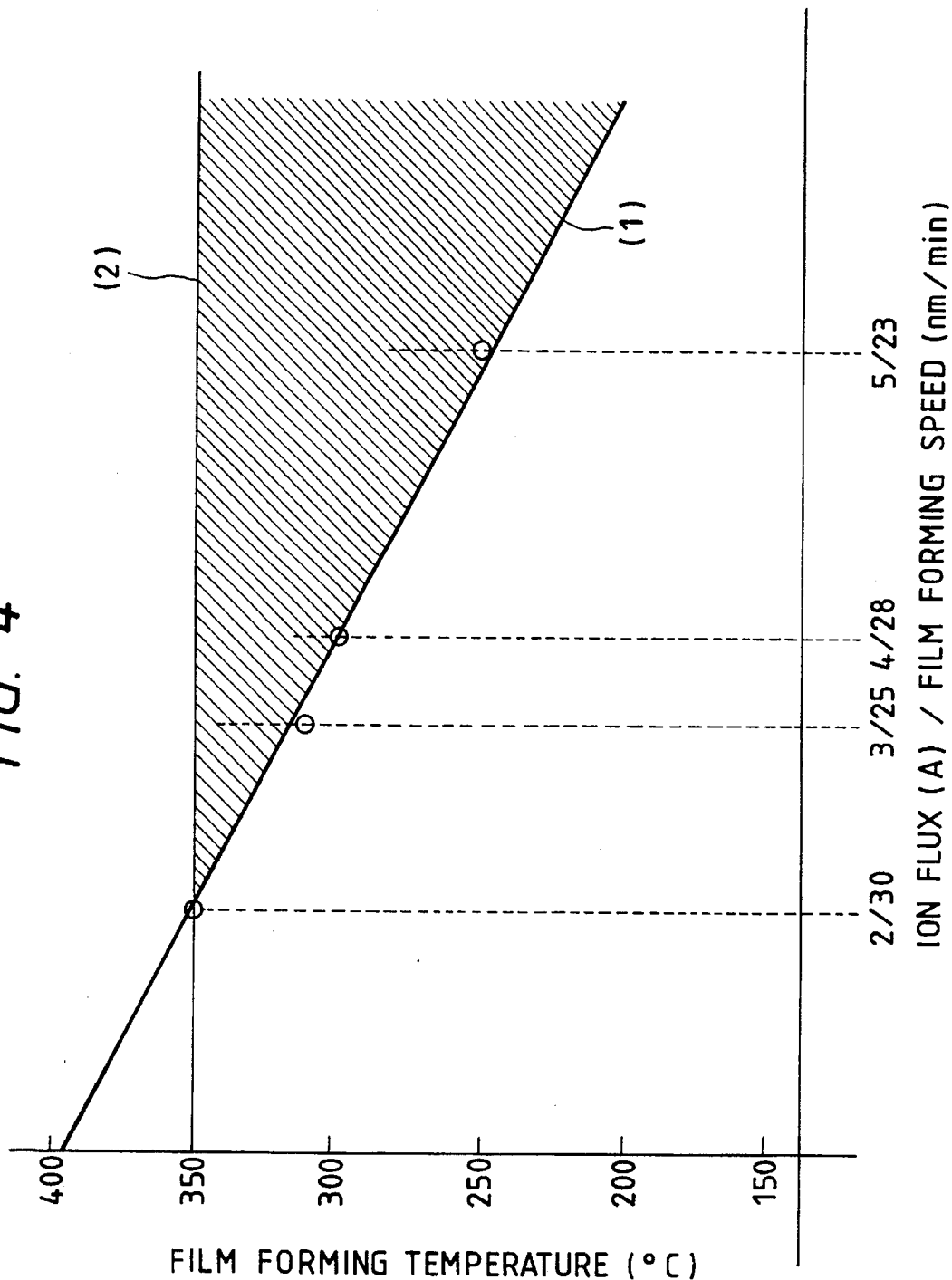
FIG. 4 graphically shows film forming conditions required for obtaining an insulating film of a high withstand voltage with a sufficient dielectric strength.

The points where the dielectric strength of FIG. 3 becomes 6 MV/cm are plotted as a straight line (1) in FIG. 4 with respect to the film forming temperature T and the ratio I/v. This straight line in FIG. 4 has a gradient of −651 (° C. nm/A min) with an intercept of 390 (° C.), and signifies that a silicon nitride film of a sufficient dielectric strength above 6 MV/cm can be obtained when formed on the upper side of this straight line (on the reverse side with respect to the origin).

At a film forming temperature of 400° C., it was observed in some cases that minute cracks were caused in the film due to the strain of the glass substrate and the stress strain of the gate electrode. Practically, therefore, a dielectric strength of 6 MV/cm is obtained within a region enclosed with the straight lines (1) and (2) in FIG. 4.

The relationship between the oxygen content in an insulating film of silicon nitride and the dielectric strength thereof was examined with regard to some samples having various dielectric strengths. Using a transmissive electron microscope and an energy dispersive X-ray analyzer (HB501 made by VG Corp.), the sectional TEM image of the step portion was observed, and the oxygen content was measured as well.

Figure 5:
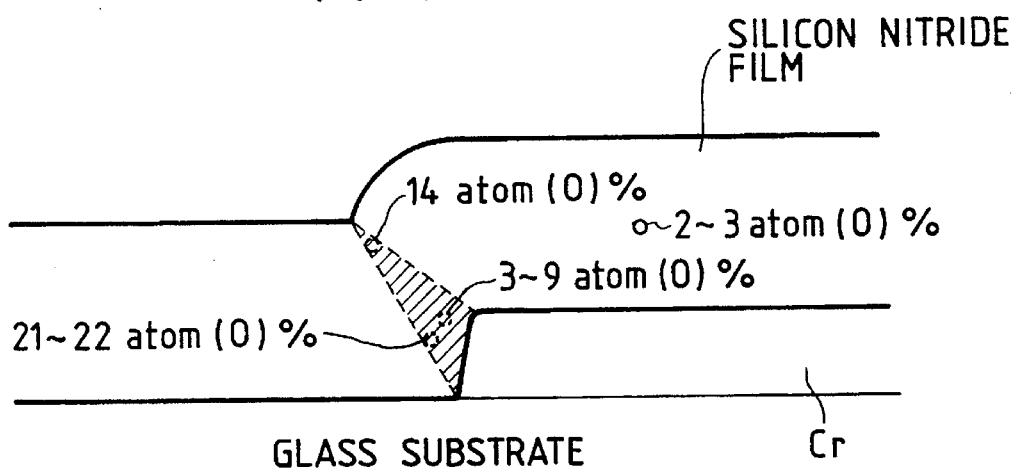
FIG. 5 typically shows a TEM image of a step portion and a distribution of oxygen contents.
Figure 6:
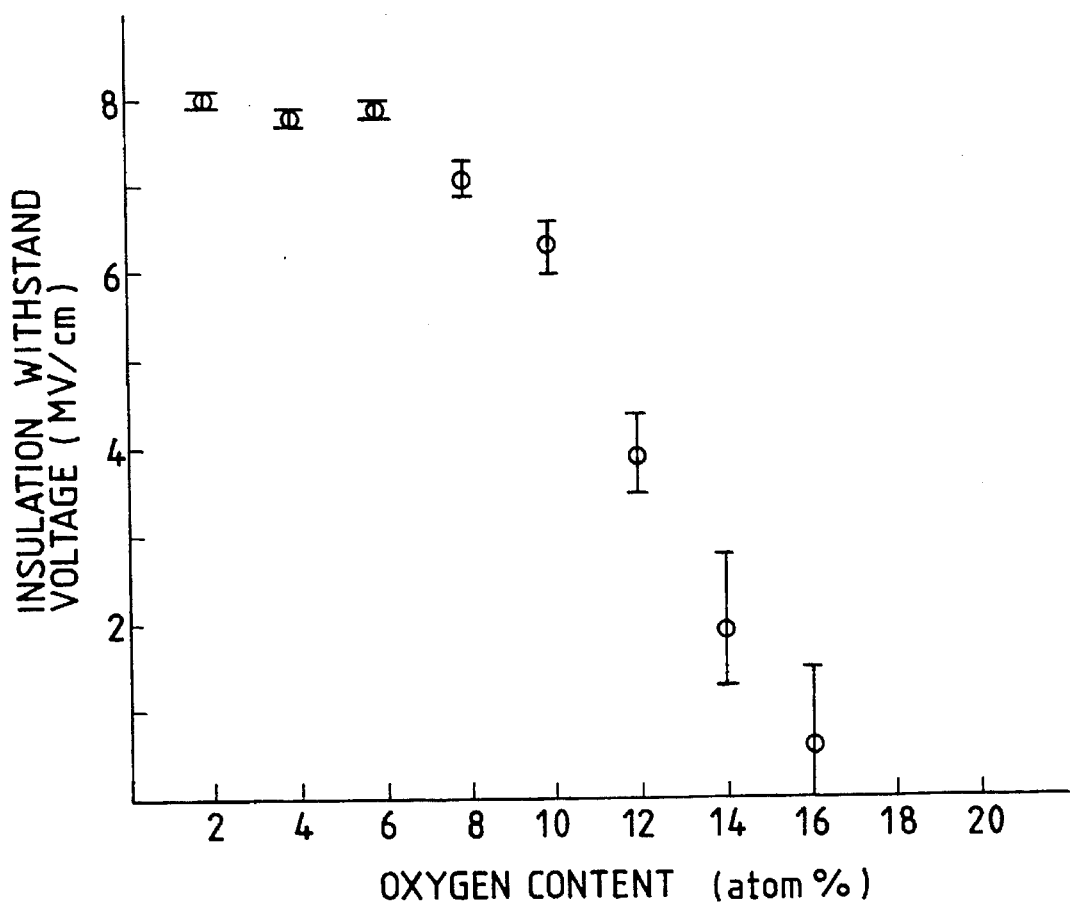
FIG. 6 graphically shows the relationship between the oxygen content and the dielectric strength (withstand voltage ) of the step portion.
Figure 7:
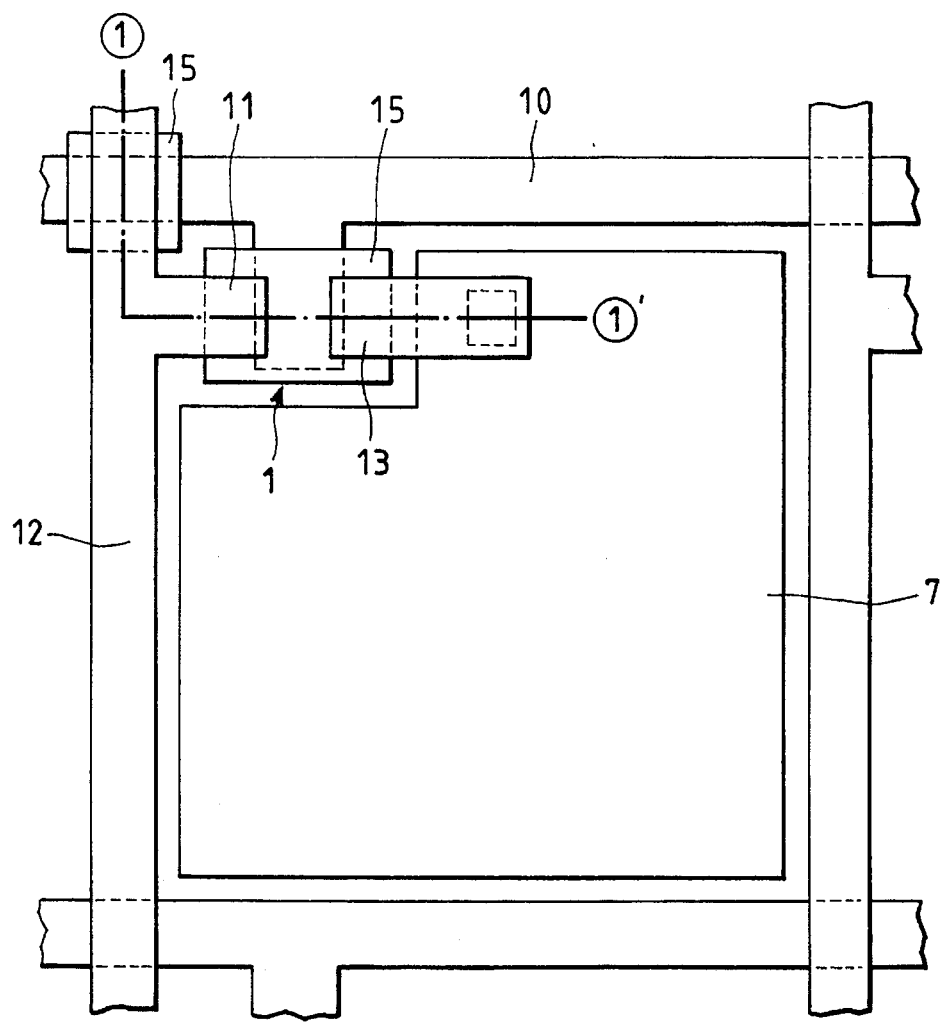
FIG. 7 is a plan view of a thin film transistor according to the related art.
Figure 8:
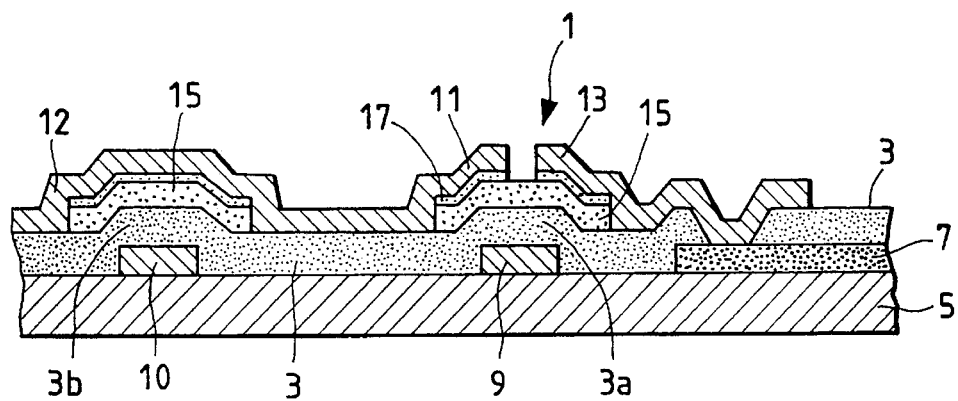
FIG. 8 is a sectional view taken along a line ①–①' shown in FIG. 7.

FIG. 5 is a typical sectional view showing exemplary oxygen contents in a silicon nitride insulating film having a dielectric strength of 0.8 MV/cm. As shown in FIG. 5, the oxygen concentration detected from the vicinity of a step portion denoted with oblique lines is higher than any of the values in the other regions. The relationship between the oxygen content and the dielectric strength in the vicinity of the step portion is graphically plotted in FIG. 6.

As obvious from this graph, the dielectric strength is sharply lowered from 6 MV/cm as the oxygen content in the vicinity of the step portion exceeds 10 atomic percent. It is also seen that, contrary to the above, a dielectric strength higher than 6 MV/cm can be obtained by suppressing the oxygen content under 10 atomic percent.

(Other characteristics)

Out of the TFTs produced according to the embodiment, the one with a silicon nitride insulating film having a dielectric strength of more than 6 MV/cm presented the following characteristics stably and indicated no deterioration thereof at all even in the continuous use for many hours.

| Film thickness | 200 nm | 300 nm |
| --- | --- | --- |
| Threshold value (V) | 1.0 | 1.0 |
| On-current (A) | $2.0 \times 10^{-6}$ | $1.5 \times 10^{-6}$ |
| Off-current (A) | $1.0 \times 10^{-15}$ | $1.0 \times 10^{-15}$ |

According to the present invention, it is possible to form with stability and facility a satisfactory insulating film of a high withstand voltage having a sufficient dielectric strength above 6 MV/cm, hence enabling production of a high stability electronic element of superior characteristics at a high yield rate.

Furthermore, since the electronic element of the present invention has a great dielectric strength and is uniform in quality, the degree of freedom in design can be enhanced to consequently realize practical application in a remarkably wide range.

Although the present invention has been described hereinabove with reference to the preferred embodiment thereof, it is to be understood that the invention is not limited to such embodiment alone, and a variety of other modifications and variations will be apparent to those skilled in the art without departing from the spirit of the invention.

The scope of the invention, therefore, is to be determined solely by the appended claims.

What is claimed is:

1. An electronic element comprising:

a substrate having an electrically-insulated surface;

a conductive wire pattern formed on the surface of the substrate, the wire pattern having an upper surface and side surfaces extending from the surface of the substrate to the upper surface of the wire pattern, and an insulating layer formed over said wire pattern such that the insulating layer contacts the side surfaces and upper surface of said wire pattern, wherein said insulating layer is composed of a silicon nitride film having a film thickness in the range of 200 to 400 nm, and wherein an oxygen content of the silicon nitride film located adjacent the side surfaces of the wire pattern is 10 atomic percent or less.

2. The electronic element according to claim 1, wherein the contact angle θ of the side surfaces of said wire pattern relative to the surface of said substrate is in the range of 60° to 90°.

3. The electronic element according to claim 1, wherein said element is a thin film transistor of inverse stagger type, said wire pattern is a gate wire, and said silicon nitride film is a gate insulating film.

* * * * *